(12) United States Patent
Herman et al.

(10) Patent No.: US 9,585,290 B2
(45) Date of Patent: Feb. 28, 2017

(54) HIGH CAPACITY STORAGE UNIT

(71) Applicant: Skyera, LLC, San Jose, CA (US)

(72) Inventors: Pinchas Herman, Sunnyvale, CA (US); William Radke, Los Gatos, CA (US); Radoslav Danilak, Cupertino, CA (US)

(73) Assignee: Skyera, LLC, San Jose, CA (US)

( * ) Notice: Subject to any disclaimer, the term of this patent is extended or adjusted under 35 U.S.C. 154(b) by 33 days.

(21) Appl. No.: 14/326,302

(22) Filed: Jul. 8, 2014

(65) Prior Publication Data

US 2015/0077922 A1    Mar. 19, 2015

Related U.S. Application Data

(60) Provisional application No. 61/846,407, filed on Jul. 15, 2013.

(51) Int. Cl.

| | |
|---|---|
| *E05C 5/02* | (2006.01) |
| *H05K 7/00* | (2006.01) |
| *H05K 7/20* | (2006.01) |
| *H05K 7/14* | (2006.01) |

(52) U.S. Cl.
CPC ....... *H05K 7/20727* (2013.01); *H05K 7/1489* (2013.01); *H05K 7/20509* (2013.01); *Y10T 29/49117* (2015.01)

(58) Field of Classification Search
CPC ..................................................... G06F 15/00
USPC ........................................ 361/679.01–679.03
See application file for complete search history.

(56) References Cited

U.S. PATENT DOCUMENTS

| | | |
|---|---|---|
| 3,878,438 A | 4/1975 | Weisman |
| 5,467,254 A | 11/1995 | Brusati et al. |
| 5,629,508 A | 5/1997 | Findley, Jr. et al. |
| 5,708,552 A | 1/1998 | Han et al. |
| 6,346,003 B1 | 2/2002 | Vilgiate |
| 6,456,500 B1 | 9/2002 | Chen |
| 6,999,309 B2 | 2/2006 | Hsu |
| 7,337,261 B2 | 2/2008 | Sukegawa et al. |
| 7,625,250 B2 | 12/2009 | Blackwell |
| 7,771,215 B1 | 8/2010 | Ni et al. |
| 7,984,303 B1 | 7/2011 | Ma et al. |
| 8,191,841 B2 | 6/2012 | Jeffery et al. |
| 8,446,729 B2 | 5/2013 | Schuette |
| 8,462,502 B2 | 6/2013 | Hirano et al. |
| 8,724,336 B2 | 5/2014 | Hanna et al. |
| 8,743,549 B2 | 6/2014 | Frink et al. |

(Continued)

OTHER PUBLICATIONS

International Search Report and Written Opinion for International Application No. PCT/US2014/066815 mailed Feb. 16, 2015 (10 pgs.).

(Continued)

*Primary Examiner* — Jerry Wu

(74) *Attorney, Agent, or Firm* — Wilmer Cutler Pickering Hale and Dorr LLP

(57) ABSTRACT

A rack mountable 10U storage unit includes a plurality of memory modules arranged in multiple rows. The storage unit also has control circuitry. Each of the memory modules have multiple heating zones and a heat spreader coupled to it. The memory modules may have heat spreaders having differing thermal dissipation capacity coupled to them. The storage unit can accommodate up to 120 memory modules due to a unique method of placing the individual memory modules.

20 Claims, 4 Drawing Sheets

(56) References Cited

U.S. PATENT DOCUMENTS

| | | |
|---|---|---|
| 8,868,898 B1 | 10/2014 | Van Hoof |
| 9,304,557 B2 | 4/2016 | Herman et al. |
| 2005/0007732 A1 | 1/2005 | Hsu |
| 2006/0146492 A1 | 7/2006 | Reents et al. |
| 2007/0112981 A1 | 5/2007 | Hernandez |
| 2007/0247804 A1 | 10/2007 | Li et al. |
| 2008/0024997 A1* | 1/2008 | Ghantiwala ............... G06F 1/20 361/719 |
| 2009/0200367 A1 | 8/2009 | Arnouse |
| 2009/0300753 A1 | 12/2009 | Lin et al. |
| 2010/0061070 A1 | 3/2010 | Koh |
| 2010/0095113 A1 | 4/2010 | Blankenbeckler et al. |
| 2010/0172087 A1 | 7/2010 | Jeffery et al. |
| 2010/0290604 A1 | 11/2010 | Wright et al. |
| 2010/0316219 A1 | 12/2010 | Boubion et al. |
| 2011/0141874 A1 | 6/2011 | Starr et al. |
| 2012/0026674 A1 | 2/2012 | Aldridge |
| 2012/0081856 A1 | 4/2012 | Hopkins et al. |
| 2012/0113582 A1 | 5/2012 | Hirano et al. |
| 2012/0134096 A1 | 5/2012 | Zhang |
| 2012/0194983 A1 | 8/2012 | Kuster |
| 2012/0275104 A1 | 11/2012 | Hamand et al. |
| 2012/0303854 A1 | 11/2012 | Karslioglu |
| 2013/0050955 A1 | 2/2013 | Shinsato et al. |
| 2013/0264027 A1* | 10/2013 | Eckberg ................. F28F 27/00 165/67 |
| 2013/0271671 A1 | 10/2013 | Sogabe |
| 2014/0040524 A1 | 2/2014 | Luck |
| 2014/0104769 A1 | 4/2014 | Wang |
| 2014/0141654 A1 | 5/2014 | Wig et al. |

OTHER PUBLICATIONS

Final Office Action mailed Jan. 14, 2016 in related U.S. Appl. No. 14/086,057 (15 pgs.).

* cited by examiner

HIGH CAPACITY STORAGE UNIT

CROSS-REFERENCES TO RELATED APPLICATIONS

This Application claims priority to and the benefit of U.S. Provisional Application No. 61/846,407, filed Jul. 15, 2013 and entitled "HIGH CAPACITY STORAGE UNIT," the contents of which are incorporated by reference herein in its entirety for all purposes.

BACKGROUND

Conventional server storage units include hard-drive based or similar storage devices. While hard-drives are cheap, the physical size of the hard-drives and the limitation of the storage capacity of each hard drive make it difficult to achieve high-density storage capacity in a standard 1U chassis.

Servers are typically arranged in one or more server racks. Each server rack can hold multiple pieces of rack-mountable units that are designed to fit in the server rack. Each rack-mountable unit is generally one of several standard dimensions measured in terms or a "rack unit." A rack unit, U or RU is a unit of measure used to describe the height of equipment intended for mounting in a 19-inch rack or a 23-inch rack. The 19-inch (48.26 cm) or 23-inch (58.42 cm) dimension refers to the width of the equipment-mounting frame in the rack, i.e. the width of the equipment that can be mounted inside the rack. One rack unit (1U) is 1.75 inches (44.45 mm) high. The size of a piece of rack-mounted equipment is frequently described as a number in "U". For example, one rack unit is often referred to as "1U", 2 rack units as "2U" and so on. Typical dimensions for a 10U unit are about 20 inches (W)×24 inches (H)×17.7 inches –21.5 inches (D).

Since the dimensions of a 10U rack-mountable chassis is fixed, depending on the physical dimensions of a hard-drive, there is only a certain memory capacity that can be packed into a traditional hard-drive based 10U storage unit. Even though hard-drives have been getting smaller in size, the inherent disadvantage of a hard-drive is its size compared to other types of memory such as Flash and DRAM.

There is a need in the industry to provide very high capacity rack-mounted storage units that can overcome the size and capacity issues of a traditional hard-drive based system.

SUMMARY

Embodiments of the present invention is generally related to rack mountable storage units. Specifically, some embodiments of the present invention provide a single storage unit that can be accommodated in a 10U rack unit. The storage unit includes up to 120 memory modules that can provided a combined storage capacity of 10 petabytes or more.

An embodiment of the present invention provides a storage unit. The storage unit includes an enclosure that has a front face, a back face opposing the front face, and two side faces. The enclosure has dimensions of between 420-450 mm width, between 500 and 500 mm height, and between 700 and 750 mm depth. The storage unit also includes a first section that includes a first plurality of memory modules and a second section that includes a second plurality of memory modules. The first and the second sections are separated by one or more control modules. The storage unit is designed to fit in a 10U rack unit.

In some embodiments, each of the first and the second plurality of memory modules includes up to 120 memory modules. In some embodiments, each of the memory modules comprises a printed circuit board (PCB) including one or more memory devices and a stiffener member attached to the PCB. The storage unit may include one or more memory devices which are multi-level cell (MLC) non-volatile memory devices.

Some embodiments of the present invention provide a storage unit. The storage unit comprises an enclosure comprising a first face and an opposing second face, a plurality of fans coupled to the first face and configured to direct airflow towards the second face, and a plurality of memory boards arranged in multiple rows from the first face to the second face. Each of the plurality of memory boards may further comprise one or more heating zones, wherein each heating zone is individually controllable, and a heat spreader coupled to the memory board. A first memory board located closest to the first face is coupled to a first heat spreader having a first thermal dissipation capacity and a second memory board located farthest from the front face is coupled to a second heat spreader having a second thermal dissipation capacity and wherein the first thermal dissipation capacity is lower than the second thermal dissipation capacity.

In some embodiments the first heat spreader comprises aluminum. In some embodiments, the second heat spreader comprises copper. In some embodiments, each of the plurality of memory boards may include one or more multi-level cell (MLC) non-volatile memory devices. In a particular embodiment, each of the memory boards is operated at a temperature of about 65° C. In some embodiments, each row in the multiple rows includes a more than one memory board and a pitch between memory boards in two adjacent rows can be same.

The following detailed description, together with the accompanying drawings will provide a better understanding of the nature and advantages of the present invention.

DETAILED DESCRIPTION

Embodiments of the present invention generally relate to a rack-mountable storage unit. Specifically, embodiments of the present invention provide a 10U rack-mountable storage unit that includes one or more memory modules and associated control electronics. The memory modules are arranged within an enclosure to maximize space utilization while at the same time maximize the storage capacity. In some embodiments, each storage unit can provide 10 petabytes or more storage capacity. Embodiments of the present invention use flash memory devices in the storage modules. In a particular embodiment, the storage modules include Multi-Level Cell (MLC) type flash memory devices.

Introduction

Figure 1:
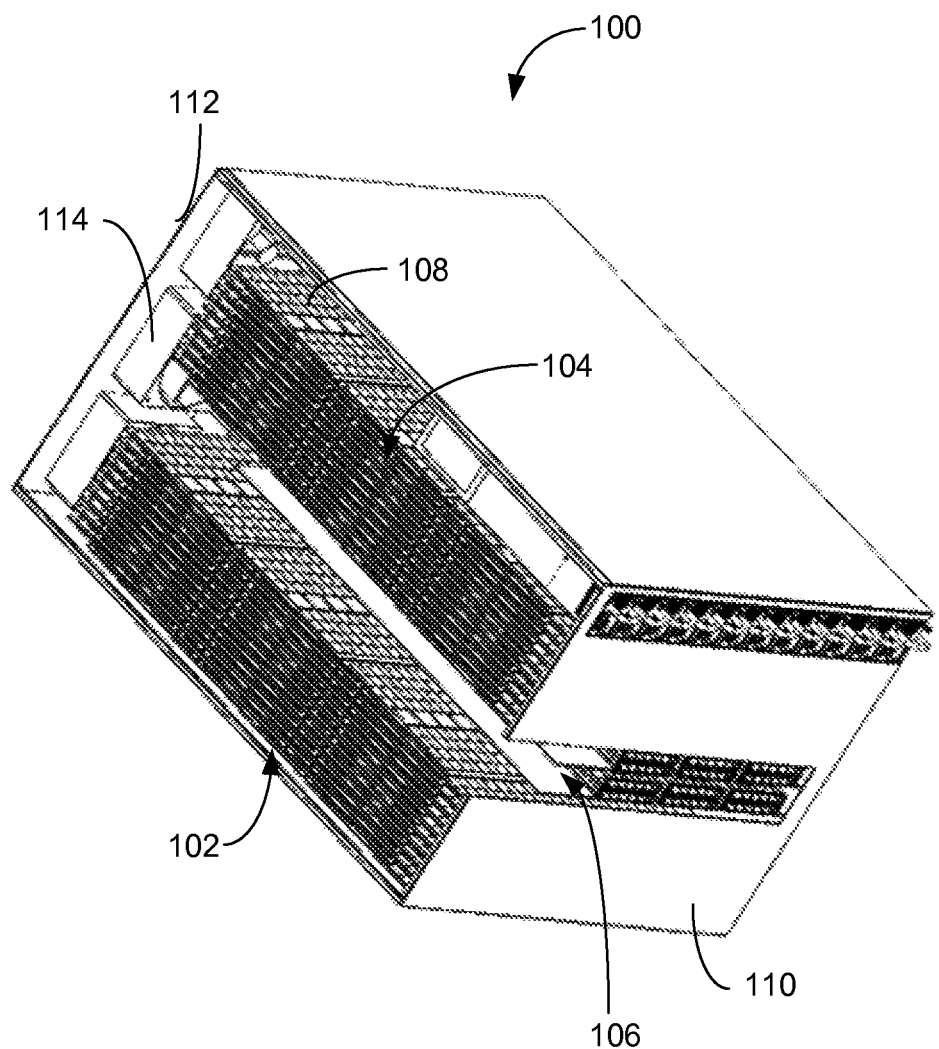
FIG. 1 illustrates a high-level diagram of a server storage unit 100 according to an embodiment of the present invention.

FIG. 1 illustrates a high-level diagram of a server storage unit 100 according to an embodiment of the present invention. Storage unit 100 includes three sections in which components are arranged. Sections 102 and 104 can include multiple storage modules 108 arranged side-by-side in a vertical orientation. Section 106 includes the control electronics that is used to control and manage the operation of storage unit 100. In some embodiments, sections 102 and 104 are maintained at an elevated temperature of about 60° C. by using active heating techniques described in detail below. Section 106 may be maintained at a relatively lower temperature since this section includes the control circuitry including processors, peripheral IC's, and other electrical components. Server unit 100 has a front face 110 and an opposing back face 112. One or more fans 114 are mounted to back face 112 and blow air towards front face 110. In operation, fans 114 direct airflow from back face 112 towards front face 110, from where it is exhausted out.

Sections 102 and 104 each can include multiple storage modules 108. Each storage module includes solid-state memory that can provide between 8 and 10 terabytes of storage capacity. One skilled in the art will realize that the amount of storage capacity on each storage module is primarily limited by the available capacity of memory devices. Advances in solid-state memory technology will result in a single memory device being able to hold terabytes of data in the near future. At such time, the storage capacity of each memory module can be greatly enhanced by using such high-capacity memory devices. Therefore, the memory capacity numbers described above are based on the technology available today. These numbers are provided merely as an example and should not be construed as limiting the claimed invention in any manner. One skilled in the art will release that the storage capacity can be increased further using the concepts described in this application as newer technology is available in the future.

Storage unit 100 also includes an interconnect board (not shown) that can be located below memory modules 108 and the control electronics. The interconnect board can provide a mechanism for electrical connection between the control electronics and the memory modules.

Figure 2:
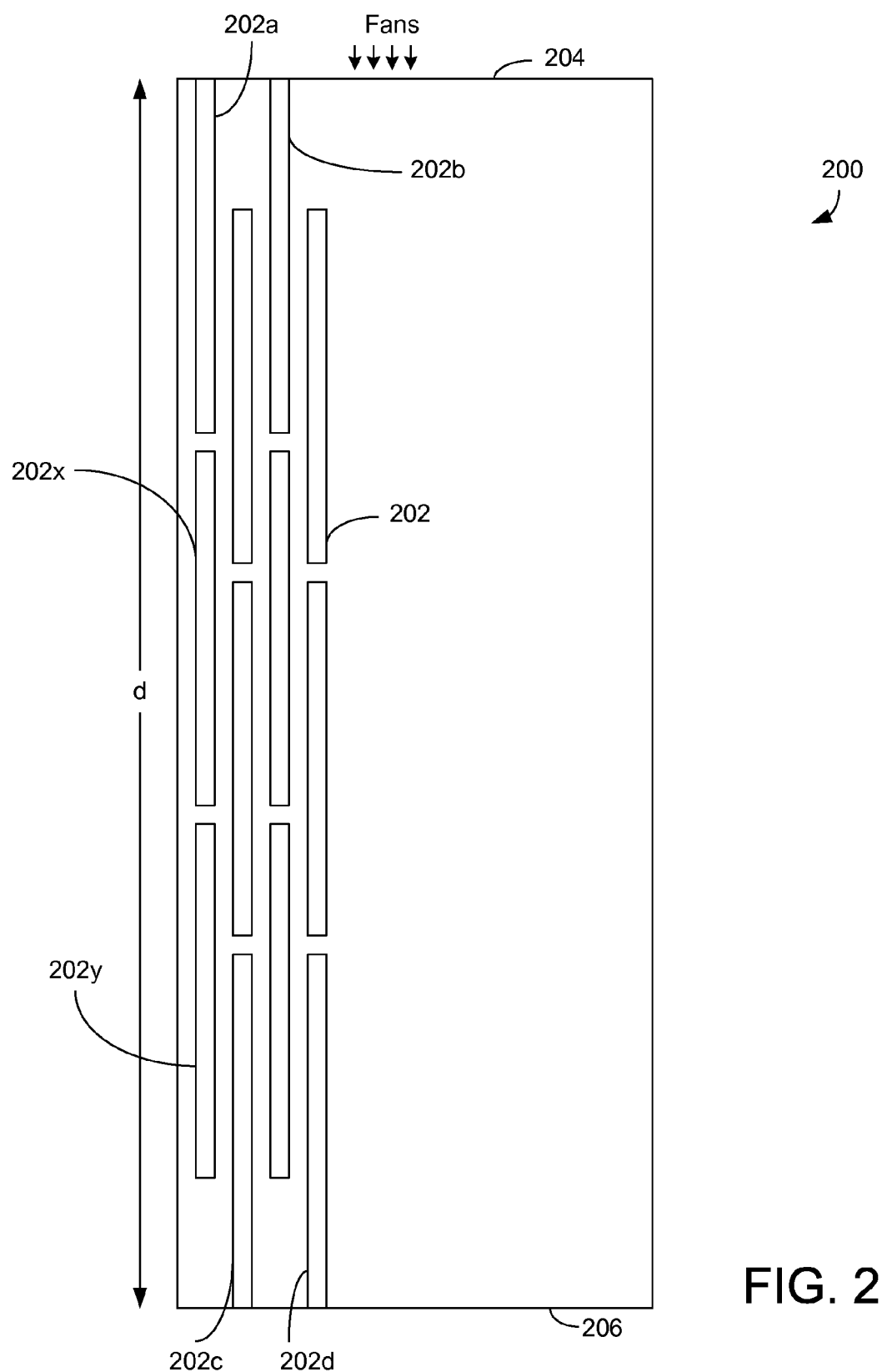
FIG. 2 illustrates close-up view of the arrangement of the memory modules according to an embodiment of the present invention.

FIG. 2 is a schematic of a top view of a section of memory modules 202 arranged inside a storage unit 200 according to an embodiment of the present invention. It is to be noted that only four rows of memory modules are illustrated in FIG. 2 for ease of explanation. As described above, as many as 120 such memory modules may be arranged in up to 40 or more rows. Each memory module 202 is vertically orientated within storage unit 200 and can be installed and uninstalled from the top. As can be seen in FIG. 2 memory modules 202 in each row are staggered in order to provide an air gap between the various modules. Storage unit 200 has a front face 204 where one or more fans (not shown) can be mounted. The fans provide the airflow needed to exhaust the heat generated by the memory modules 202. The air is exhausted from back face 206 of storage unit 200. In some embodiments, memory modules 202 may need to be operated at a temperature that is elevated from the ambient temperature. This elevated or 'operating' temperature for the memory modules can be predetermined and can range from about 60° C. to about 70° C. As illustrated in FIG. 2, the pitch between the memory modules of adjacent rows is constant throughout the depth 'd' of storage unit 200.

As described above, each memory module may be operated at a temperature between 60° C. and 70° C. Due to the arrangement of the memory boards inside the storage unit, the memory boards closest to the fans, e.g., memory boards 202a and 202b in FIG. 2, experience a larger airflow and consequently a larger thermal dissipation compared to memory boards 202c and 202d that are located farther away from the fans. Thus, the fans create a significant thermal gradient across each row of memory boards. However, since the operating temperature of the memory boards is between 60° C. to about 70° C., active heating of certain memory boards and/or certain sections of the memory board may be implemented. It is desirable to keep the thermal gradient across a memory board and/or a row of memory boards to within ±3%.

Active Heating Zones

Figure 3:
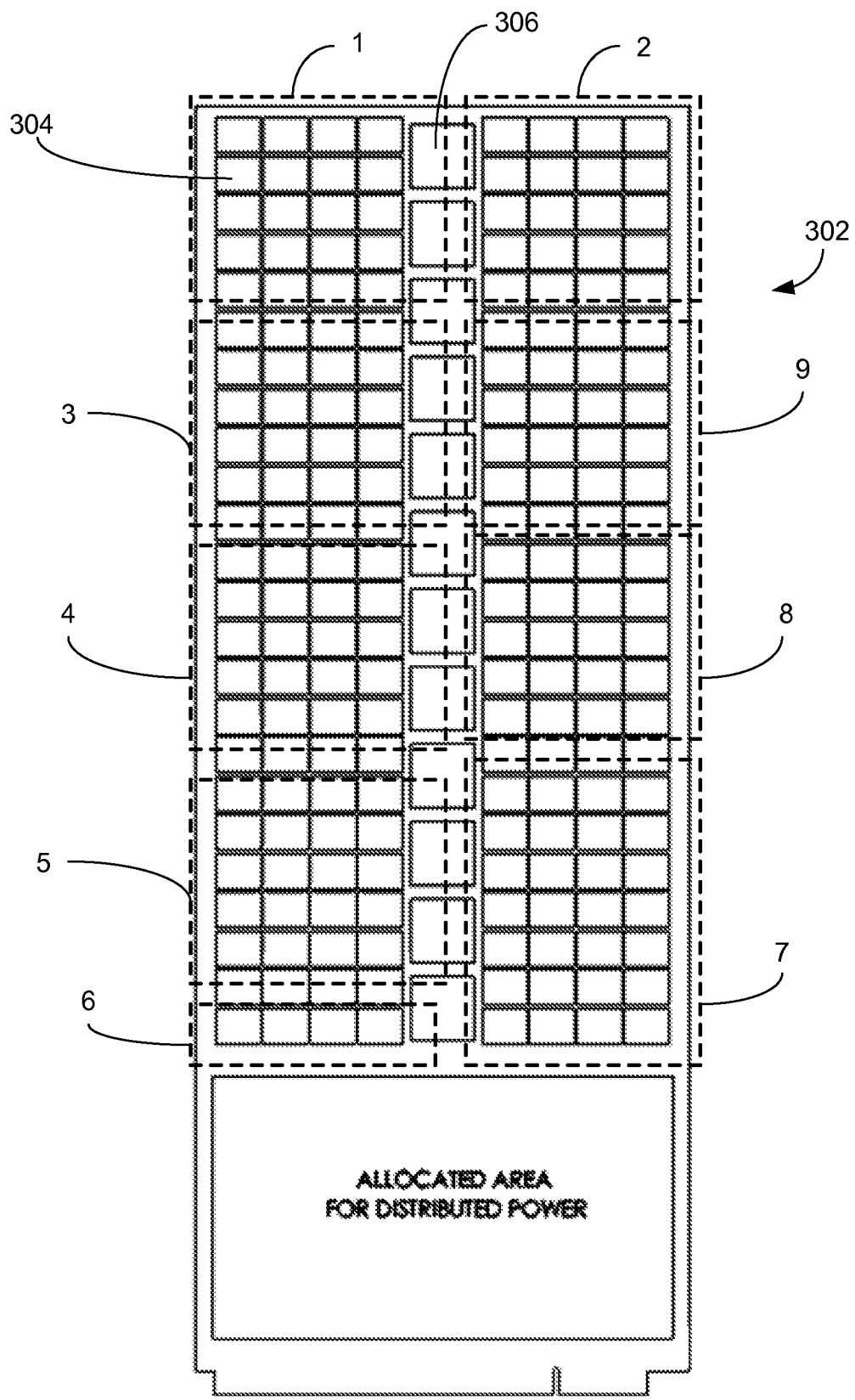
FIG. 3 illustrates a high-level schematic of a memory module including heating zones according to an embodiment of the present invention.

FIG. 3 illustrates an individual memory board 302 illustrating the various heating zones according to an embodiment of the present invention. Memory board 302 may include multiple memory devices/chips 304 and one or more peripheral chips 306. The combined storage capacity of all the chips 304 on memory board 302 determines the storage capacity of memory board 302. In an embodiment, each memory board 302 may have a storage capacity of between 80 and 200 terabytes. As illustrated, memory board 302 includes multiple heating zones. FIG. 3 shows 9 heating zones 1-9; however one skilled in the art will realize that the number of heating zones can be adjusted based on the requirements and other factors affecting the operation of the memory boards. Further, the size and shape of each heating zone can be adjusted based on the needs. In some embodiments, each heating zone may have same area. In other embodiments, each heating zone may have a different area. Each of these heating zones 1-9 can be individually controlled to operate at a desired temperature. In some embodiments, adaptive heating control can be implemented in which one or more temperature sensors are embedded into each memory board. The output of the temperature sensor can be fed to a controller, which can adjust the heating up or down as needed. Any known technique of closed loop temperature control, e.g., resistive heating, may be used for heating the memory boards. For example, in some instances the airflow from the fans can vary due to fan failure or degradation. This can result in reduced thermal dissipation from the storage unit, which can lead to an overall rise in ambient temperature immediately surrounding the memory boards. In this situation, the heating of individual memory boards may have to be lowered or turned off.

In some embodiments, not all memory boards in the storage unit may have equal number of heating zones. For example, memory board placed near the fans, e.g., boards 202a and 202b of FIG. 2, may have more heating zones compared to memory boards that are farther away from the fans, e.g., boards 202c and 202d of FIG. 2, or vice versa. In some embodiments, each memory board may have between 2 and 10 heating zones. Additional heating zones may be added as needed. Each heating zone can be operated independently of the other heating zones to provide precise temperature control of each memory board. In this manner, each memory board can be controlled to operate at the desired temperature. In some embodiments, no active heating may be need for some memory boards based on their location with storage unit 200. In some embodiments, some memory boards may not be provided with any active heating mechanism and such memory boards may be designated for use in certain areas of storage unit, e.g., in a location farthest from the fans.

Thermal Management Using Variations in Thermal Coating

Referring back to FIG. 2, as described above, during operation, the memory boards generate a lot of heat as a result of the packing density of the memory boards and also the amount of memory on each board. The fans blow air in a single direction from front face 204 towards back face 206. The fan speed can be adjusted to generate the proper exhaust characteristics needed for storage unit 200. Because of the airflow generated by the fans, the memory boards closer to the fans/front face are cooled at a faster rate compared to the memory boards that are place farther from the fans, i.e. closer to the back face of storage unit 200. In one embodiment, different thermal coatings can be applied to the boards for enabling thermal dissipation. Various materials and techniques can aid in thermal dissipation. Examples of such thermal dissipation materials or 'heat spreaders' include but are not limited to metal-based coating such as Al, Cu, etc., phase change materials, carbon nanotubes, remote cooling systems, etc. Each of these types of materials provides varying degree/efficiency of thermal dissipation characteristics.

In some embodiments, memory boards in a single row may each have a different heat spreader associated with it based on the thermal dissipation efficiency of the heat spreader. For example, as illustrated in FIG. 2 above, the first row includes three memory boards 202a, 202x and 202y. Each of these memory boards has a different type of heat spreader. For instance, since memory board 202a is the closest to the fans, it will experience a stronger airflow and hence experience faster cooling compared to memory boards 202x and 202y. Since each memory board is operated a certain operating temperature, it would be beneficial to have a heat spreader that has a low thermal dissipation capability connected to board 202a. This will ensure that board 202a does not experience rapid cooling and not much energy will be used to actively heat board 202a to keep that board at the operating temperature.

In contrast, since board 202y is the farthest from the fans, a heat spreader with a higher thermal dissipation capacity than the one used for board 202a can be beneficial. This will enable quicker heat dissipation for board 202y thereby preventing damage to the board due to excessive temperature. In some embodiments, board 202x may have a heat spreader that has a higher thermal dissipation efficiency than the heat spreader used for board 202a but a lower thermal dissipation efficiency compared to the heat spreader used for board 202y. In this manner, the temperature gradient across a row of memory boards can be maintained within the predetermined range. In some embodiments, a single type of heat spreader may be used for the entire memory board. For example, a memory board may be coated with an Al or Cu film that may act as the heat spreader. In other embodiments, a combination of various types of heat spreaders may be used for a single memory board. For example, a memory board may include phase change material that is coupled to a portion of the memory board and carbon nanotubes may be coupled to a different portion of the memory board.

In some embodiments, active heating of memory boards may be supplemented and/or substituted by channeling the heat from near back face 206 of storage unit 200 to the memory boards near front face 204. This will result in efficient use of the heat generated by the memory board and reduce the need for active heating of the memory boards. One skilled in the art will realize many more variations.

Thermal Management Using Variations in Pitch

Figure 4:
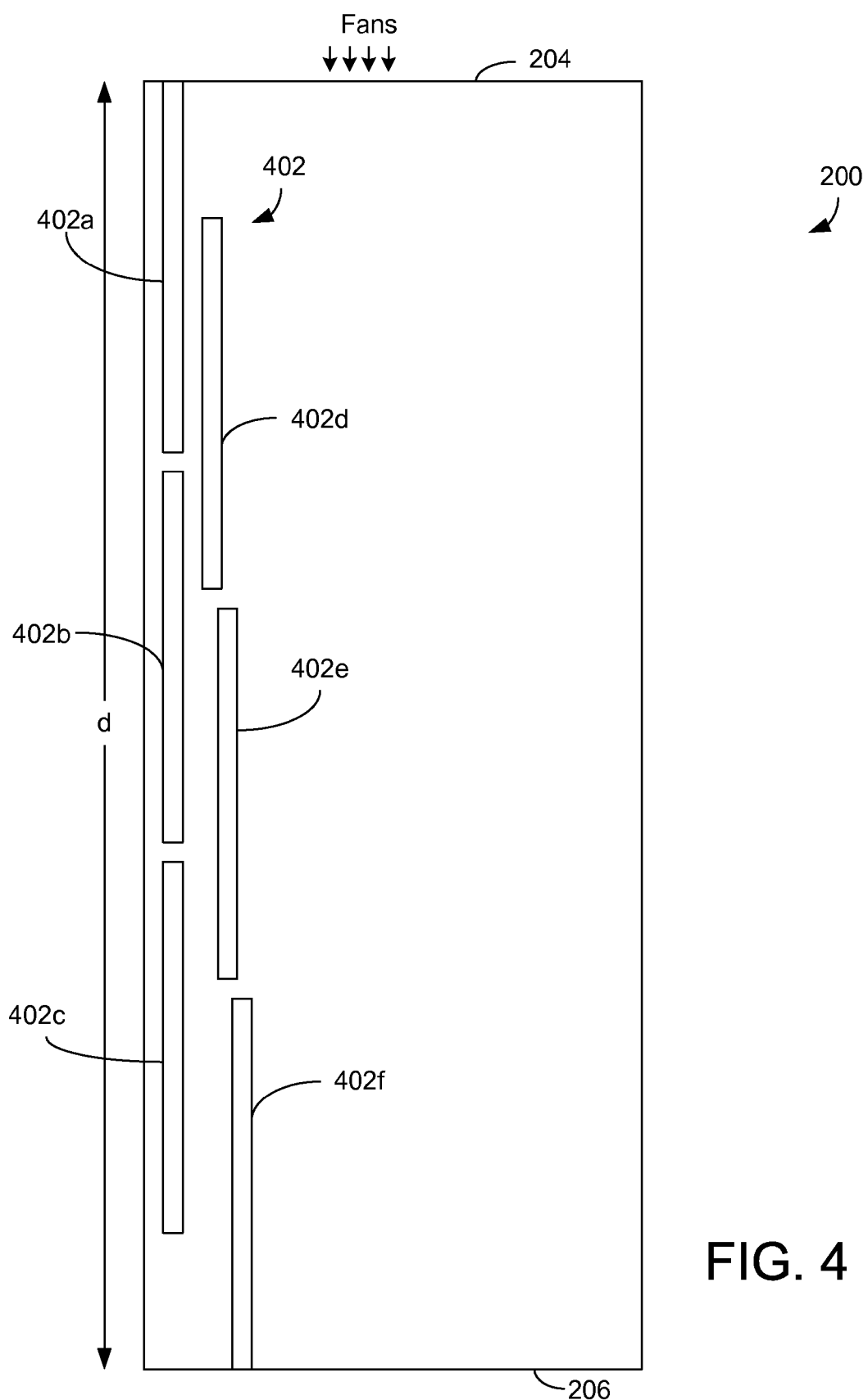
FIG. 4 is a schematic that illustrates an alternative arrangement of memory modules according to another embodiment of the present invention.

FIG. 4 illustrates an alternative arrangement of memory boards 402 according to another embodiment of the present invention. As described above in relation to FIG. 2, the memory boards that are closest to the fans experience faster cooling compared to the memory boards that are farther away from the fans. In order to account for such difference in cooling capacity, memory boards maybe arranged such that the pitch between two adjacent boards increases as the boards are placed from the front face to the back face. For example, as illustrated in FIG. 4, the pitch between memory boards 420a and 402d is smaller than the pitch between boards 402b and 402e. The pitch between boards 402c and 402e is greater than the pitch between boards 402b and 402e. In this manner, the boards are placed farther apart the farther they are from the fans. This provides more air gap for the heat to be dissipated. This may help in maintaining the temperature gradient across the length of the storage unit. In some embodiments, such varying pitch arrangement may be used in lieu of the other temperature dissipation methods described above. In other embodiments, the varying pitch arrangement may be used in addition to the other temperature dissipation methods described above.

The techniques described above allow creation of a high-density rack-mountable storage unit, which is otherwise not possible using conventional techniques. Techniques described herein allow packaging of up to 120 memory modules in a standard 10U rack unit. It is to be noted that a 10U rack unit is used herein as an example to illustrate the various embodiments. One skilled in the art will realize that the various techniques described herein can also be applied in storage units that have dimensions different from a standard 10U unit. Thus, the embodiments of the present invention are not limited to a 10U rack mountable storage unit.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A storage unit comprising: an enclosure comprising a first face and an opposing second face; a plurality of fans coupled to the first face and configured to direct air flow towards the second face; a plurality of memory boards arranged in multiple rows from the first face to the second face, wherein each of the plurality of memory boards comprises: one or more temperature sensors configured to output a temperature value; a plurality of heating zones, wherein each heating zone is configured to operate independently of other heating zones to provide temperature control of a corresponding memory board based on the temperature value of the one or more temperature sensors; the temperature control comprising adjusting a resistive heating and the airflow speed; and a heat spreader coupled to the memory board, wherein a first memory board located closest to the first face is coupled to a first heat spreader having a first thermal dissipation capacity and a second memory board located farthest from the front face is coupled to a second heat spreader having a second thermal dissipation capacity; and wherein the first thermal dissipation capacity is lower than the second thermal dissipation capacity.

2. The storage unit of claim 1 wherein the first heat spreader comprises aluminum.

3. The storage unit of claim 1 wherein the second heat spreader comprises copper.

4. The storage unit of claim 1 wherein each of the plurality of memory boards include one or more multi-level cell (MLC) non-volatile memory devices.

5. The storage unit of claim 1 wherein each of the memory boards is operated at a temperature of about 65° C.

6. The storage unit of claim 1 wherein each row in the multiple rows includes a more than one memory board.

7. The storage unit of claim 6 wherein a pitch between memory boards in two adjacent rows is same.

8. A method for manufacturing a high-capacity solid-state storage unit, the method comprising: configuring a first face of an enclosure to receive a plurality of fans configured to direct air flow towards a second face of the enclosure opposite the first face; configuring each of a plurality of memory boards in at least one of a plurality of rows from the first face to the second face according to a heat spreader coupled to the memory board, wherein a first memory board located closest to the first face is coupled to a first heat spreader having a first thermal dissipation capacity and a second memory board located farthest from the front face is coupled to a second heat spreader having a second thermal dissipation capacity that is different from the first thermal dissipation capacity; configuring one or more temperature sensors to output a temperature value corresponding to a temperature of a corresponding memory board; and configuring each of a plurality of heating zones that include the plurality of memory boards to operate independently of other heating zones to provide temperature control of a corresponding memory board based on the temperature value of the one or more temperature sensors; the temperature control comprising adjusting a resistive heating and the airflow speed.

9. The storage unit of claim 1 further comprising configuring the first heat spreader to include aluminum.

10. The storage unit of claim 1 further comprising the second heat spreader to include copper.

11. The storage unit of claim 1 wherein each of the plurality of memory boards include one or more multi-level cell (MLC) non-volatile memory devices.

12. The storage unit of claim 1 wherein configuring each of the plurality of heating zones to be individually controllable comprises configuring an operating temperature to approach 65° C.

13. The storage unit of claim 1 wherein each row in the plurality of rows includes more than one of the plurality of memory boards.

14. The storage unit of claim 1 wherein configuring each of the plurality of memory boards in at least one of the plurality of rows from the first face to the second face comprises configuring a pitch between one or more memory boards in two adjacent rows.

15. The storage unit of claim 14 wherein the pitch is configured to vary according to a predetermined difference.

16. The storage unit of claim 14 wherein the pitch is configured to be substantially the same.

17. A backplane of a high-capacity storage device comprising:

circuitry configured to receive a plurality of memory boards arrange in a plurality of rows across a surface of the backplane allowing a first memory board in the plurality of memory boards located toward a first end of the surface to utilize a first type of thermal dissipater having a first thermal dissipation capacity and a second memory board in the plurality of memory boards located toward another opposite second end of the surface to utilize a second type of thermal dissipater having a second thermal dissipation capacity lower than the first thermal dissipation capacity; a plurality of fans coupled to the first end and configured to direct air flow towards the second end; and circuitry configured to manage a plurality of heating zones across the surface, wherein each heating zone is operated independently of the other heating zones to provide temperature control of a corresponding memory board based on a temperature value of the one or more temperature sensors configured to measure a temperature of the corresponding memory board; the temperature control comprising adjusting a resistive heating and the airflow speed.

18. The backplane of claim 17 wherein the first thermal dissipater comprises aluminum and the second thermal dissipater comprises copper.

19. The storage unit of claim 1 wherein each of the plurality of memory boards include one or more multi-level cell (MLC) non-volatile memory devices.

20. The storage unit of claim 1 wherein the circuitry configured to manage the one or more heating zones is configured to target each of the memory boards to operate at a temperature approaching 65° C.

* * * * *